(12) United States Patent
Cho

(10) Patent No.: US 7,749,843 B2
(45) Date of Patent: Jul. 6, 2010

(54) METHOD FOR FABRICATING SEMICONDUCTOR DEVICE WITH BULB-SHAPED RECESS GATE

(75) Inventor: Jun-Hee Cho, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 951 days.

(21) Appl. No.: 11/413,189

(22) Filed: Apr. 28, 2006

(65) Prior Publication Data

US 2007/0148980 A1    Jun. 28, 2007

(30) Foreign Application Priority Data

Dec. 28, 2005   (KR) .................... 10-2005-0132499

(51) Int. Cl.
  *H01L 21/336* (2006.01)
  *H01L 21/302* (2006.01)
  *H01L 21/461* (2006.01)
(52) U.S. Cl. .................. 438/270; 438/272; 438/717; 438/756
(58) Field of Classification Search .......... 438/151, 438/717, 756, 270, 272; 257/E21.035
See application file for complete search history.

(56) References Cited

U.S. PATENT DOCUMENTS

| 5,654,218 | A  | * | 8/1997 | Lee ........................ 438/301 |
| 6,972,241 | B2 | * | 12/2005 | Chiu et al. ................ 438/424 |
| 2005/0139952 | A1 | * | 6/2005 | Koh ........................ 257/510 |
| 2005/0282394 | A1 | * | 12/2005 | Chiba ...................... 438/711 |

FOREIGN PATENT DOCUMENTS

| JP | 2002-093819 | 3/2002 |
| KR | 1999-0011414 | 2/1999 |

* cited by examiner

*Primary Examiner*—William M. Brewster
(74) *Attorney, Agent, or Firm*—IP & T Law Firm PLC

(57) ABSTRACT

A method for fabricating a semiconductor device with a bulb-shaped recess gate pattern is provided. The method includes forming a plurality of oxide layers over a substrate; forming a silicon layer to cover the oxide layers; forming a mask over the silicon layer; etching the silicon layer using the mask as an etch mask to form a plurality of first recesses to expose the oxide layers; etching the oxide layers to form a plurality of second recesses; and forming a plurality of gate patterns at least partially buried into the first recesses and the second recesses.

15 Claims, 3 Drawing Sheets

METHOD FOR FABRICATING SEMICONDUCTOR DEVICE WITH BULB-SHAPED RECESS GATE

RELATED APPLICATION

The present application is based upon and claims the benefit of priority to the Korean patent application No. KR 2005-0132499, filed in the Korean Patent Office on Dec. 28, 2005, the entire contents of which are incorporated herein by reference.

TECHNICAL FIELD

The present invention relates to a method for fabricating a semiconductor device; and more particularly, to a method for fabricating a semiconductor device with a bulb-shaped recess gate pattern.

DESCRIPTION OF RELATED ARTS

As for a typical method for forming a planar gate interconnection line by forming a gate over a flat active region, the current large integration scale of semiconductor devices has caused a channel length to be decreased but an implantation doping concentration to be increased. Accordingly, due to an increased electric field, a junction leakage is generated and thus, it becomes difficult to secure a refresh property of a device.

To improve the aforementioned limitations, a recess gate process forming a gate after etching a substrate defined as an active region into a recess pattern is implemented as a method for forming a gate interconnection line. If the recess gate process is used, a channel length can be incased and an implantation doping concentration can be decreased, thereby improving a refresh property of a device.

However, as a design rule of a semiconductor device has been decreased, it has been difficult to obtain a sufficient refresh property. Also, there is a limitation in a depth of a recess. The more deeply the recess is formed, the worse the recess profile becomes. Thus, securing a sufficient channel length may be limited.

Accordingly, a bulb-shaped recess gate process that makes a width of a lower portion of the recess gate wide is suggested. The bulb-shaped recess gate process is performed using an oxide based spacer with the implementation of a dry etching process. At this time, plasma damage may be generated in a junction, and a doping profile of the junction may be badly affected. Also, a physical profile may not be uniform due to an isotropic etching process performed without directionality.

SUMMARY

The present invention provides a method for fabricating a semiconductor device with a bulb-shaped recess gate pattern capable of preventing plasma damage during a bulb-shaped recess gate process.

Consistent with the present invention, there is provided a method for fabricating a semiconductor device. The method includes forming a plurality of oxide layers over a substrate; forming a silicon layer to cover the oxide layers over the substrate; forming a mask over the silicon layer; etching the silicon layer using the mask as an etch mask to form a plurality of first recesses to expose the oxide layers; etching the oxide layers to form a plurality of second recesses; and forming a plurality of gate patterns partially buried into the first recesses and the second recesses.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The above and other features of the present invention will become better understood with respect to the following description of the exemplary embodiments given in conjunction with the accompanying drawings, in which.

DETAILED DESCRIPTION

Hereinafter, detailed descriptions on certain embodiments of the present invention will be provided with reference to the accompanying drawings.

FIGS. 1A to 1E are cross-sectional views illustrating a method for fabricating a semiconductor device consistent with the present invention.

Figure 1A:
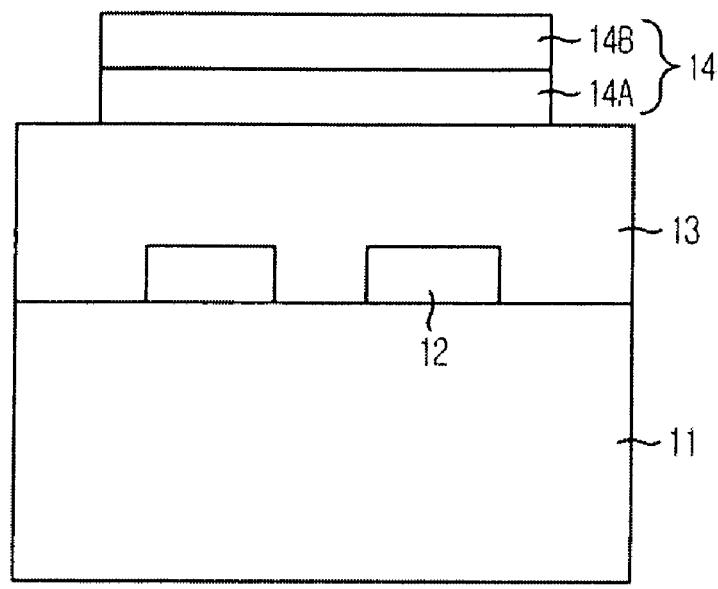
FIGS. 1A to 1E are cross-sectional views illustrating a method for fabricating a semiconductor device with a bulb-shaped recess gate pattern consistent with the present invention.

As shown in FIG. 1A, a plurality of oxide layers 12 are formed over certain portions of a substrate 11 where bulb-shaped recess gate patterns are to be formed.

A silicon layer 13 is formed over the oxide layers 12 to fill spaces between the oxide layers 12. Herein, the silicon layer 13 is formed to provide subsequent bulb-shaped recess gate patterns, and grown over the substrate 11 including the oxide layers 12 through one of a silicon epitaxy growth (SEG) process and a solid phase epitaxy (SPE) process.

A first mask pattern 14 is formed over the silicon layer 13. Herein, the first mask pattern 14 serves a role in defining a device isolation region, and is formed by sequentially stacking an anti-reflective coating layer 14A and a photoresist layer 14B.

To form the first mask pattern 14, the anti-reflective coating layer 14A and the photoresist layer 14B are formed over the silicon layer 13 and then, the photoresist layer 14B is subjected to a photo-exposure process and a developing process, thereby opening a device isolation region. Herein, the photoresist layer 14B uses cycloolefin-maleic anhydride (COMA) or acrylate based polymer, and the anti-reflective coating layer 14A includes an organic based material. Furthermore, the photo-exposure process subjected to the photoresist layer 14B is performed using argon fluoride (ArF) as a light source. After the photo-exposure process and the developing process, the photoresist layer 14B is formed in a bar type or T-type pattern, and the anti-reflective coating layer 14A is etched using the photoresist layer 14B as an etch mask.

Figure 1B:
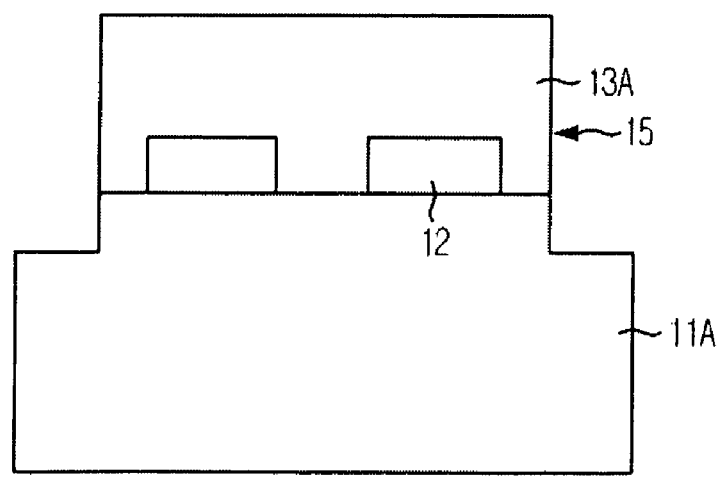

As shown in FIG. 1B, the silicon layer 13 and the substrate 11 are etched using the first mask pattern 14 as an etch mask, thereby forming a plurality of trenches 15. Each of the trenches 15 is formed by etching the silicon layer 13 and the substrate 11 to a depth ranging from approximately 2,000 Å to approximately 3,000 Å to form device isolation layers defining an active region. Herein, a patterned substrate and a patterned silicon layer are denoted with reference numerals 11A and 13A, respectively.

Figure 1C:
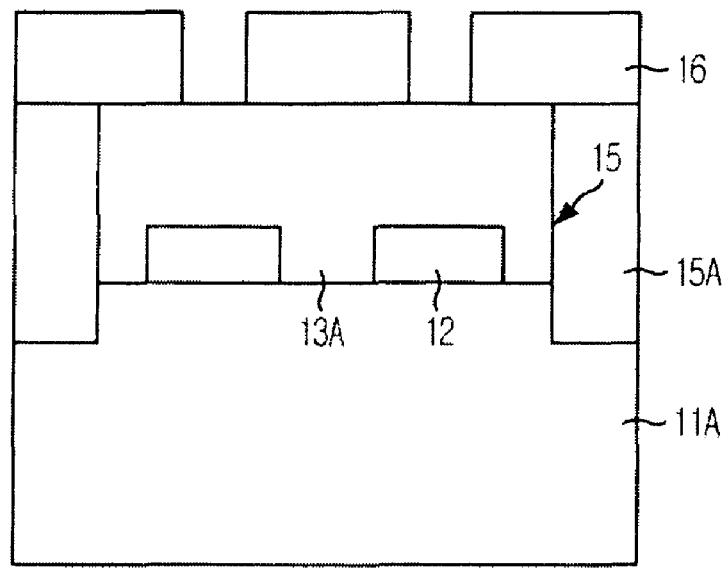

As shown in FIG. 1C, an insulation material is buried into the trenches 15 and planarized, thereby forming a plurality of device isolation layers 15A.

A second mask pattern 16 opening regions in which recesses are to be formed is formed over the patterned silicon layer 13 and the device isolation layers 15A. Herein, the regions in which the recesses are to be formed are defined by making the oxide layers 12 exposed after a subsequent etching process of the patterned silicon layer 13A.

Figure 1D:
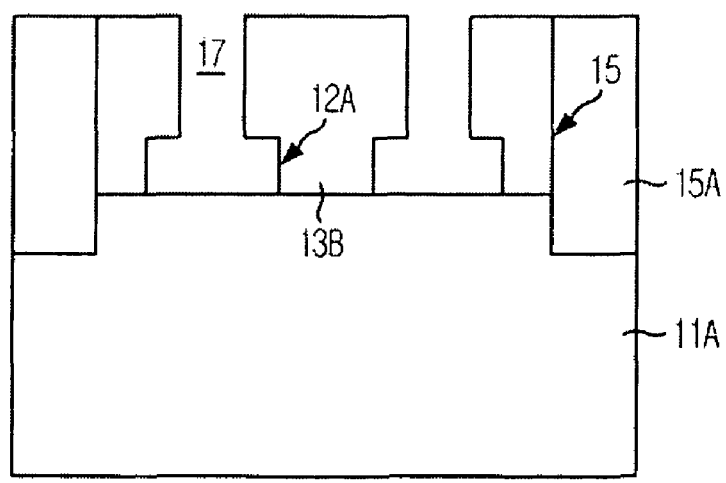

As shown in FIG. 1D, the patterned silicon layer 13A is etched by using the second mask pattern 16 as an etch mask, thereby forming a plurality of first recesses 17. The patterned silicon layer 13A is etched to completely expose surfaces of the oxide layers 12. Herein, a reference numeral 13B denotes a more patterned silicon layer.

The second mask pattern 16 is removed and then, the oxide layers 12 are removed, thereby forming a plurality of second recesses 12A. Herein, the removing of the oxide layers 12 is performed by using a wet etching process. The wet etching process uses a solution of hydrogen fluoride (HF) or buffered oxide etchant (BOE).

The first recess 17 and the second recess 12A compose a recess shaped like a bulb and, is referred to as a bulb-shaped recess hereinafter.

Figure 1E:
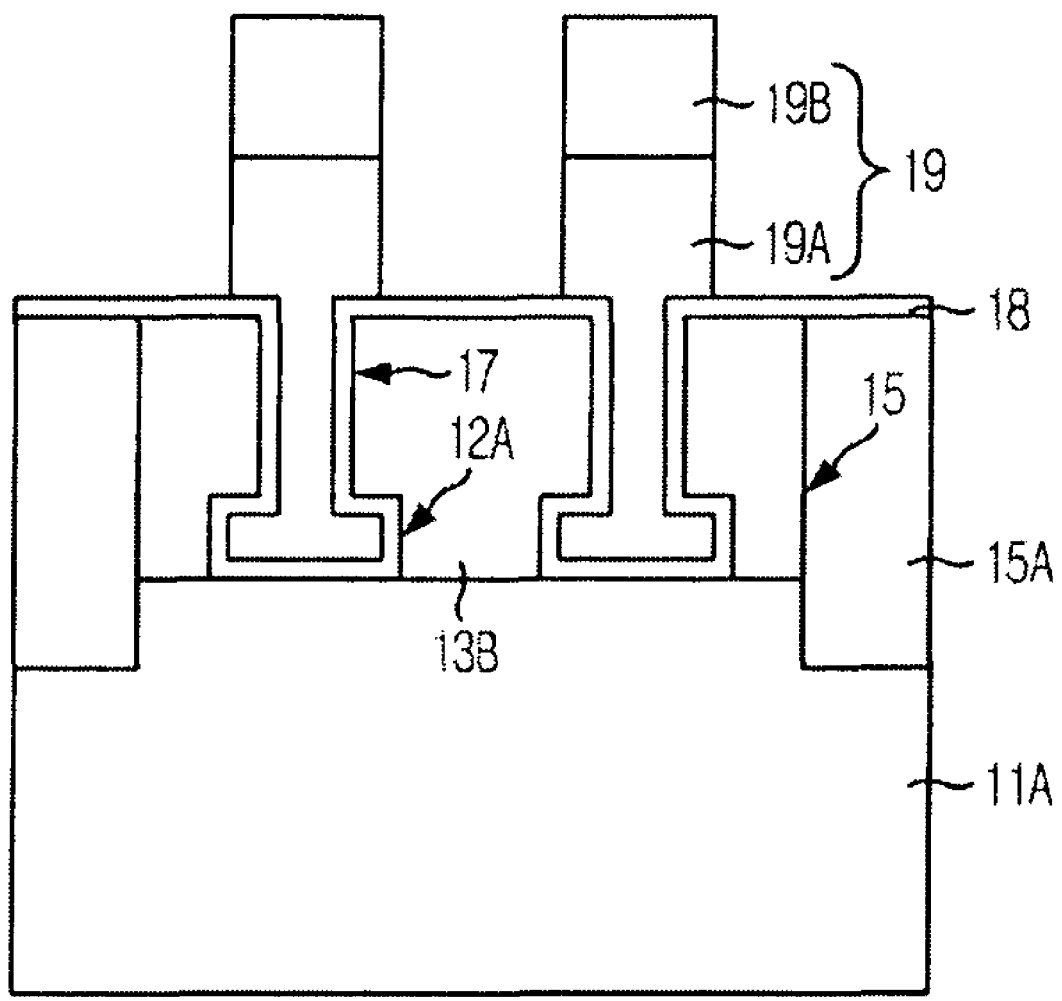

As shown in FIG. 1E, a gate insulation layer 18 is formed over the entire surface of the above resulting structure illustrated in FIG. 1D and then, a plurality of gate patterns 19 are formed. One portion of the individual gate pattern 19 is buried into the respective bulb-shaped recess, and the other portion of the individual gate pattern 19 is exposed to an upper portion of the more patterned silicon layer 13B. Herein, each of the gate patterns 19 includes a gate electrode 19A, and a gate hard mask 19B formed in sequential order.

Consistent with the present invention, oxide layers are formed in regions in which bulb-shaped recess gate patterns are to be formed and a silicon layer is grown in advance and then, the oxide layers are removed by performing a wet etching process. Accordingly, it is possible to prevent plasma damage from being generated due to a dry etching process and form a uniform profile of a recess.

The method for fabricating the semiconductor device with a bulb-shaped recess gate pattern can prevent plasma damage from being generated during a bulb recess gate process and secure a uniformity of a profile, thereby improving reliability of a device.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device comprising:
   forming a plurality of oxide layers over a substrate;
   growing a silicon layer over the oxide layers and the substrate to cover the oxide layers;
   forming a mask over the silicon layer;
   etching the silicon layer using the mask as an etch mask to form a plurality of first recesses to expose a portion of each of the oxide layers;
   removing the oxide layers to form a plurality of second recesses; and
   forming a plurality of gate patterns,
   wherein each of the first recesses and a respective one of the second recesses form a bulb-shaped recess, a portion of each gate pattern is buried in a respective one of the bulb-shaped recesses, and the oxide layers are formed to have a size commensurate with that of the second recesses.

2. The method of claim 1, wherein the growing of the silicon layer uses one of a silicon epitaxy growth (SEG) process and a solid phase epitaxy (SPE) process.

3. The method of claim 1, wherein the removing of the oxide layers is performed using a wet etching process.

4. The method of claim 3, wherein the wet etching process is performed using one of a solution of hydrogen fluoride (HF) and buffered oxide etchant (BOE).

5. The method of claim 1, further comprising, before the forming of the mask:
   sequentially forming an anti-reflective coating layer and a photoresist layer over the silicon layer;
   performing a photo-exposure process and a developing process on the photoresist layer to expose regions of the substrate in which device isolation layers are to be formed;
   etching the anti-reflective coating layer using the photoresist layer as an etch mask; and
   etching the silicon layer and the substrate using the photoresist layer and the anti-reflective coating layer as an etch mask to form a plurality of trenches.

6. The method of claim 5, wherein the etching of the silicon layer and the substrate comprises forming the trenches in a thickness ranging from approximately 2,000 Å to approximately 3,000 Å.

7. The method of claim 5, wherein the photoresist layer includes one of cycloolefin-maleic anhydride and acrylate based polymer.

8. The method of claim 5, wherein the anti-reflective coating layer includes an organic based material.

9. The method of claim 5, wherein performing the photo-exposure process uses argon fluoride (ArF) as a light source.

10. The method of claim 5, wherein performing the photo-exposure process and the developing process comprises forming the photoresist layer in one of a bar type and T-type pattern.

11. The method of claim 1, further comprising, before the forming of the mask and after the growing of the silicon layer:
   forming a plurality of device isolation layers.

12. The method of claim 5, further comprising, after the etching of the silicon layer and the substrate:
   filling the trenches with an insulation material; and
   performing a planarization process to form the device isolation layers.

13. A method for fabricating a semiconductor device comprising:
   forming a plurality of oxide patterns over a substrate;
   growing a silicon layer over the oxide patterns and the substrate to cover the oxide patterns;
   forming a mask over the silicon layer;
   etching the silicon layer using the mask as an etch mask to form a plurality of first recesses to expose a portion of each of the oxide patterns;
   removing the entire oxide patterns to form a plurality of second recesses; and
   forming a plurality of gate patterns at least partially buried into the first recesses and the second recesses,
   wherein the oxide patterns are formed to have a size commensurate with that of the second recesses.

14. The method of claim 13, further comprising, before the forming of the mask and after the growing of the silicon layer:

forming a plurality of device isolation layers.

15. The method of claim 14, wherein the forming of the device isolation layers includes:

etching the silicon layer to form a plurality of trenches;
filling the trenches with an insulation material; and
performing a planarization process to form the device isolation layers.

\* \* \* \* \*